(12) United States Patent
Yano et al.

(10) Patent No.: US 6,419,149 B1
(45) Date of Patent: Jul. 16, 2002

(54) METHOD FOR PRODUCING WIRING LAYER TRANSFER COMPOSITE

(75) Inventors: Kentaro Yano, Shimane-ken; Susumu Okikawa, Tokyo; Noboru Hanai, Tottori-ken, all of (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

(21) Appl. No.: 09/515,072

(22) Filed: Feb. 28, 2000

(30) Foreign Application Priority Data

Feb. 26, 1999 (JP) ............................. 11-049325
Mar. 4, 1999 (JP) ............................. 11-056707
Jan. 20, 2000 (JP) ........................... 2000-011413

(51) Int. Cl.[7] .......................... B23K 20/04; H05K 1/09; C23C 14/14; C23C 14/24
(52) U.S. Cl. ............................ 228/235.1; 228/235.2; 228/235.3; 427/250; 427/251
(58) Field of Search ...................... 428/612, 620, 428/671, 675, 216, 601; 29/846; 228/235.1, 235.2, 235.3; 427/250, 251

(56) References Cited

U.S. PATENT DOCUMENTS

| | | | |
|---|---|---|---|
| 4,011,982 A | | 3/1977 | Marancik |
| 5,021,296 A | * | 6/1991 | Suzuki et al. |
| 5,426,850 A | | 6/1995 | Fukutomi et al. |
| 5,901,436 A | * | 5/1999 | Ohsawa et al. |
| 6,240,632 B1 | * | 6/2001 | Ito et al. |

FOREIGN PATENT DOCUMENTS

| | | |
|---|---|---|
| EP | 0 751 561 A1 | 2/1997 |
| JP | 7-55384 | 7/1988 |
| JP | 1-133689 | 5/1989 |

\* cited by examiner

Primary Examiner—Deborah Jones
Assistant Examiner—Jason Savage
(74) Attorney, Agent, or Firm—Sughrue Mion, PLLC

(57) ABSTRACT

A wiring layer transfer composite constituted by a laminate composed of a carrier layer, a barrier layer and a wiring-forming layer, the barrier layer being a continuous layer substantially free from defects, can be produced by (a) preparing a first Cu-based metal foil having an average thickness of 50 $\mu$m or less and an average surface roughness Rz of 5 $\mu$m or less in both surfaces for the carrier layer; (b) preparing a second Cu-based metal foil having an average thickness of 20 $\mu$m or less and an average surface roughness Rz of 5 $\mu$m or less in both surfaces for the wiring-forming layer; (c) vapor-depositing a metal having different etchability from that of Cu onto at least one of the first metal foil and the second metal foil to form the barrier layer having an average thickness of 1 $\mu$m or less; and (b) pressure-welding both metal foils via the barrier layer.

17 Claims, 4 Drawing Sheets

METHOD FOR PRODUCING WIRING LAYER TRANSFER COMPOSITE

BACKGROUND OF THE INVENTION

The present invention relates to a wiring layer transfer composite used for the production of semiconductor packages and a method and an apparatus for producing such a wiring layer transfer composite.

Recently, the number of input/output terminals of a semiconductor device is increasing, as the level of integration of semiconductor chips increases. Thus, semiconductor packages having large numbers of input/output terminals have been demanded. The input/output terminals are generally classified into a type arranged in a row around the semiconductor package, and a type arranged in a large number of rows in a two-dimensional manner not only around the semiconductor package but also under it. In the former, the arrangement pitch of the input/output terminals should be decreased to increase their number, though connection between the input/output terminals and the wiring on a circuit board is difficult at a pitch of 0.5 mm or less. In the latter type, the input/output terminals can be arranged in a relatively large pitch, advantageous in increase in the number of input/output terminals.

In the latter arrangement of input/output terminals, there are a pin grid array (PGA) type having connection pins and a ball grid array (BGA) type. Because connection pins are inserted into opening-type terminals of a circuit board in the PGA type, it is not suitable for surface mounting. On the other hand, the BGA type enables surface mounting, suitable for the mounting of small, thin semiconductor packages in laptop computers, cellular phones, etc. Because these digital devices are increasingly miniaturized and made thinner, the pitch of pins used for semiconductor packages is becoming narrower.

Adopted to form connection pins of a BGA type is a method in which a thin copper foil is etched to provide wiring for semiconductor chips. It has been tried to make a wiring-forming copper foil as thin as about 1–18 $\mu$m. However, when such a thin copper foil is used, it should be provided with enough rigidity to improve handling. Proposed for that purpose is, for instance, a method of attaching an aluminum carrier sheet to the copper foil. In such a simple two-layer structure, however, the carrier sheet per se needs to be made thicker, resulting in the problem that etching specks are likely to be generated by removal of the carrier sheet.

Under such circumstances, a transfer method disclosed in Japanese Patent Laid-Open No. 8-293510 has recently been attracting much attention as a method for forming wiring patterns for semiconductor packages. One example of this transfer method is shown in FIGS. 7(a)–(g). A Ni plating layer is formed as a barrier layer 2 on a carrier sheet 1 composed of a electrolytic copper foil (step (a)), and a dry photoresist film 4 is laminated thereon (step (b)). The dry photoresist film 4 is exposed to light in a desired pattern and developed to provide a laminate having recesses 4a for wiring pattern (step (c)). This laminate is immersed in a copper sulfate solution to carry out electrolytic copper plating (step (d)). Next, the resist layer 4 is removed by using a potassium hydroxide solution to provide a transfer foil laminate 6 having a three-layer structure in which a copper wiring pattern 3 is formed (step (e)). The transfer foil laminate 6 is set in a cavity of a molding die, into which a semiconductor-sealing epoxy resin is injected and cured, thereby embedding copper wiring in a cured epoxy resin layer 5 (step (f)). The carrier sheet 1 and the barrier layer 2 are removed by selective etching, thereby leaving only a copper wiring 3 in the cured epoxy resin layer 5 (step (g)).

When wiring having a thickness of 18 $\mu$m or less is formed by this transfer method, a copper foil is used as a carrier sheet 1 for providing rigidity for easiness of handling. The barrier layer 2 is used for the purposes of (i) preventing an etching solution from reaching the carrier sheet 1 when the dry photoresist film 4 is etched to form a wiring pattern, and (ii) preventing an etching solution from reaching the wiring 3 when the carrier sheet 1 is removed by etching after embedding the copper wiring 3 in the cured epoxy resin layer 5. Accordingly, the barrier layer 2 should be made of a metal having different etchability from that of the wiring.

The above transfer method is advantageous in that etching specks are not likely to be generated on a wiring copper foil transferred to a semiconductor-sealing epoxy resin, because the barrier layer is selectively etched after the carrier sheet 1 is selectively etched. However, because it is a method in which a wiring is produced by forming a Ni plating layer in recesses 4a generated by the etching of a dry photoresist film 4, its steps are complicated.

To solve the above problem, the inventors have investigated the production of a wiring layer transfer composite having a three-layer structure by pressure-welding a copper foil for a carrier layer and a copper foil for a wiring-forming layer via a barrier layer by a high-speed continuous bonding method such as rolling, etc. As a result, it has been found that because the barrier layer 2 is as extremely thin as 1 $\mu$m or less, the barrier layer 2 is broken at the time of pressure welding such as rolling for producing a wiring layer transfer composite.

Accordingly, an object of the present invention is to provide a wiring layer transfer composite having a barrier layer as extremely thin as 1 $\mu$m or less without breakage, and a method and apparatus for producing such a wiring layer transfer composite.

SUMMARY OF THE INVENTION

As a result of intense research in view of the above object, it has been found that a wiring layer transfer composite constituted by a laminate composed of a wiring-forming layer, a barrier layer and a carrier layer can be obtained substantially without generating defects such as breakage in the barrier layer, by making the average surface roughness Rz of the wiring-forming layer and the carrier layer as small as 5 $\mu$m or less, by forming as extremely thin a barrier layer as 1 $\mu$m or less in an average thickness on at least one of the wiring-forming layer and the carrier layer, and by pressure-welding the wiring-forming layer and the carrier layer via the barrier layer. The present invention has been completed based on this finding.

Thus, the wiring layer transfer composite according to the present invention is constituted by a laminate composed of a Cu-based carrier layer having an average thickness of 50 $\mu$m or less, a barrier layer made of a metal having different etchability from that of Cu and having an average thickness of 1 $\mu$m or less, and a Cu-based, wiring-forming layer having an average thickness of 20 $\mu$m or less, the barrier layer being a continuos layer substantially free from defects.

Each of the carrier layer and the wiring-forming layer preferably has an average surface roughness Rz of 5 $\mu$m or less in both surfaces. Each of the carrier layer and the wiring-forming layer is preferably made of substantially pure copper. The barrier layer is preferably a plating or vapor deposition layer of nickel.

The composite metal foil according to the present invention is constituted by a laminate composed of a first metal foil based on Cu and having an average thickness of 50 µm or less, a barrier layer made of a metal having different etchability from that of Cu and having an average thickness of 1 µm or less, and a second metal foil based on Cu and having an average thickness of 20 µm or less, the barrier layer being a continuous layer substantially free from defects.

The first method for producing a composite metal foil according to the present invention comprises the steps of (a) plating a metal having different etchability from that of Cu onto the first metal foil or the second metal foil to form a barrier layer having an average thickness of 1 µm or less; (b) conducting an activation treatment onto a surface of the barrier layer and a surface of the first or second metal foil on which the barrier layer is not formed; and (c) pressure-welding both metal foils in such a manner that the activated surfaces are facing each other.

The second method for producing a composite metal foil according to the present invention comprises the steps of (a) vapor-depositing a metal having different etchability from that of Cu onto the first metal foil or the second metal foil to form a barrier layer having an average thickness of 1 µm or less; (b) heating both of the first and second metal foils to a temperature of 300° C. or higher; and (c) pressure-welding both metal foils via the barrier layer.

The third method for producing a composite metal foil according to the present invention comprises the steps of (a) vapor-depositing a metal having different etchability from that of Cu onto at least one of the first metal foil and the second metal foil to form a barrier layer having an average thickness of 1 µm or less; and (b) pressure-welding both metal foils via the barrier layer.

The first method for producing a wiring layer transfer composite according to the present invention comprises the steps of (a) preparing a first Cu-based metal foil having an average thickness of 50 µm or less and an average surface roughness Rz of 5 µm or less in both surfaces for a carrier layer; (b) preparing a second Cu-based metal foil having an average thickness of 20 µm or less and an average surface roughness Rz of 5 µm or less in both surfaces for a wiring-forming layer; (c) plating a metal having different etchability from that of Cu onto the first metal foil or the second metal foil to form a barrier layer having an average thickness of 1 µm or less; (d) conducting an activation treatment onto a surface of the barrier layer and a surface of the first or second metal foil on which the barrier layer is not formed; and (e) pressure-welding both metal foils in such a manner that the activated surfaces are facing each other. The activation treatment is preferably ion etching.

The second method for producing a wiring layer transfer composite according to the present invention comprises the steps of (a) preparing a first Cu-based metal foil having an average thickness of 50 µm or less and an average surface roughness Rz of 5 µm or less in both surfaces for a carrier layer; (b) preparing a second Cu-based metal foil having an average thickness of 20 µm or less and an average surface roughness Rz of 5 µm or less in both surfaces for a wiring-forming layer; (c) plating a metal having different etchability from that of Cu onto the first metal foil or the second metal foil to form a barrier layer having an average thickness of 1 µm or less; (d) heating both of the first and second metal foils to a temperature of 300° C. or higher; and (e) pressure-welding both metal foils via the barrier layer.

The third method for producing a wiring layer transfer composite according to the present invention comprises the steps of (a) preparing a first Cu-based metal foil having an average thickness of 50 µm or less and an average surface roughness Rz of 5 µm or less in both surfaces for a carrier layer; (b) preparing a second Cu-based metal foil having an average thickness of 20 µm or less and an average surface roughness Rz of 5 µm or less in both surfaces for a wiring-forming layer; (c) vapor-depositing a metal having different etchability from that of Cu onto at least one of the first metal foil and the second metal foil to form a barrier layer having an average thickness of 1 µm or less; and (d) pressure-welding both metal foils via the barrier layer. The barrier layer is preferably formed by vacuum vapor deposition.

In any production methods, the pressure welding is carried out by rolling at a draft of 2% or less.

The apparatus for producing a composite metal foil according to the present invention comprises a vacuum chamber, a vapor deposition means disposed in the vacuum chamber, a pair of guide rolls disposed in the vacuum chamber at a position opposite to the vapor deposition means, and pressure rolls for continuously pressure-welding a first metal foil and a second metal foil which are subjected to vapor deposition while passing over the guide rolls, in such a manner that vapor-deposited surfaces of the first and second metal foils are opposing each other.

DETAILED DESCRIPTION OF THE PREFERRED EMBODIMENTS

Figure 1:
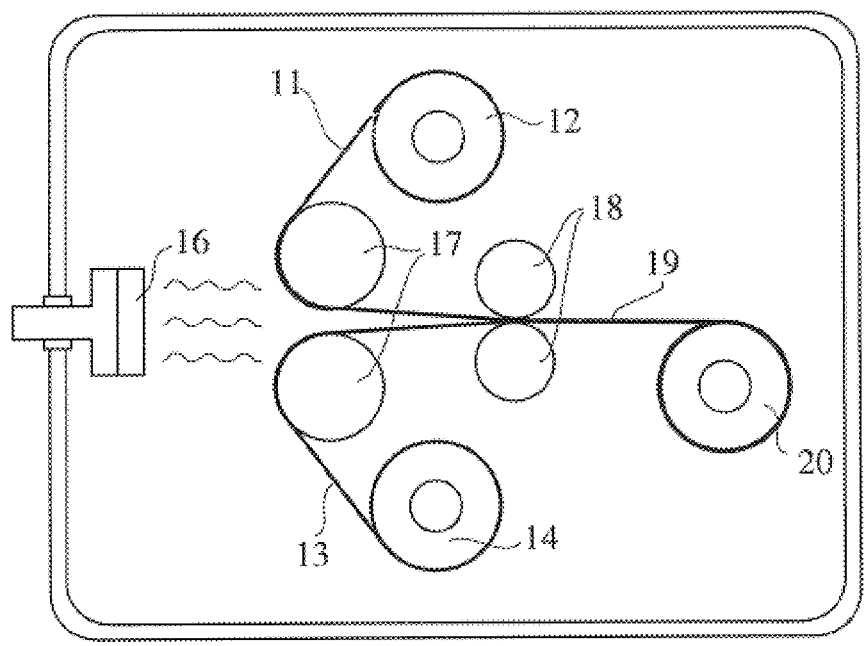
FIG. 1 is a schematic view showing a vacuum chamber apparatus for continuously carrying out vapor deposition and pressure welding.

[1] Wiring Layer Transfer Composite (A) Carrier Layer

The carrier layer is made of a metal based on Cu. The Cu-based metals may be not only pure copper such as electrolytic copper but also copper-based alloys, and pure copper is preferable from the aspect of electric conductivity and economy. With the carrier layer and the wiring made of substantially the same materials, etching can be carried out for both layers in the same facility, thereby resulting in reduction of production cost.

Because the carrier layer is preferably thin from the aspect of efficiency in etching, its average thickness is 50 µm or less. However, too thin a carrier layer does not have enough rigidity. Accordingly, the carrier layer preferably has an average thickness of 10–30 μm.

Both surfaces of the carrier layer should be as flat as possible. The reason therefor is that if the carrier layer is too rough in any of a surface to be pressure-welded or a surface not to be pressure-welded, uneven pressure is applied to the pressure-welded surface in the step of pressure welding with the wiring-forming layer. As a result, projections on a surface of the carrier layer penetrate into a body of a thin barrier layer of 1 μm or less in an average thickness, resulting in breakage in the barrier layer. Thus, both surfaces of the carrier layer should have an average surface roughness Rz of 5 μm or less. The preferred average surface roughness Rz of the carrier layer is 3 μm or less. Incidentally, with respect to a lower limit of the average surface roughness Rz, it would be disadvantageous if it were less than 0.1 μm from the aspect of mass production and cost. Therefore, the preferred average surface roughness Rz is 0.1–3 μm.

With respect to the maximum surface roughness Rmax of the carrier layer in both surfaces, it is preferably 6 μm or less. For the same reason as above, when the maximum surface roughness Rmax exceeds 6 μm, the barrier layer is likely to suffer from defects such as breakage at the time of pressure welding.

(B) Wiring-forming Layer

The wiring-forming layer is made of a metal based on Cu. The reasons therefor are that when Cu is used for wiring for semiconductor packages, (i) it is possible to achieve high transmission efficiency of electric signals because of good electric conductivity, (ii) etching can be carried out uniformly at a high speed, and (iii) it provides advantages such as excellent heat dissipation. Like the carrier layer, the Cu-based metals may be not only pure copper such as electrolytic copper but also copper-based alloys, and pure copper is preferable from the aspect of electric conductivity and economy.

The wiring-forming layer is preferably as thin as possible to enable small-gap wiring. Accordingly, the average thickness of the wiring-forming layer is 20 μm or less. Too thin a wiring-forming layer cannot easily be produced and handled and is likely to generate problems such as noises. Accordingly, the wiring-forming layer preferably has an average thickness of preferably 3–20 μm, more preferably 5–18 μm, and most preferably 7–12 μm.

Both surfaces of the wiring-forming layer should be as flat as 5 μm or less in an average surface roughness Rz. If the average surface roughness Rz of the wiring-forming layer is more than 5 μm, projections on a surface of the wiring-forming layer penetrate into a body of the barrier layer between the carrier layer and the wiring-forming layer at the time of pressure welding, resulting in breakage in the barrier layer. The preferred average surface roughness Rz of the wiring-forming layer is 3 μm or less. Incidentally, with respect to a lower limit of the average surface roughness Rz, it would be disadvantageous if it were less than 0.1 μm from the aspect of mass production and cost. Therefore, the preferred average surface roughness Rz is 0.1–3 μm.

With respect to the maximum surface roughness Rmax of the wiring-forming layer in both surfaces, it is preferably 6 μm or less. For the same reason as above, when the maximum surface roughness Rmax exceeds 6 μm, the barrier layer is likely to suffer from defects such as breakage at the time of pressure welding.

(C) Barrier Layer

The barrier layer is formed on the carrier layer and/or the wiring-forming layer in a surface to be pressure-welded for the following purposes: (i) an etching solution does not reach the carrier layer when a wiring pattern is formed on the wiring-forming layer by an etching solution, and (ii) an etching solution does not reach the wiring when the carrier layer is removed by etching. Therefore, the barrier layer should be made of a metal having different etchability from that of the carrier layer and the wiring-forming layer, namely a metal having different etchability from that of Cu. The metals having different etchability from that of Cu may be nickel, aluminum, gold, solder, tin, titanium, chromium or alloys thereof. Incidentally, when the barrier layer is a plating layer, it needs not be made of pure metal, but may be made of a metal compound such as Ni—P.

Because the barrier layer should be removed by etching after the formation of wiring by etching of the wiring-forming layer, it is preferably thin. Accordingly, the average thickness of the barrier layer is 1 μm or less, preferably 0.5 μm or less. The lower limit of the average thickness of the barrier layer varies depending on the formation method of the barrier layer. When it is formed by a plating method, the barrier layer preferably has an average thickness of 0.3 μm or more. If it were thinner than this, pores are likely to be generated in the resultant barrier layer. On the other hand, when it is formed by a vapor depositing such as physical vapor depositing, the lower limit of the average thickness of the barrier layer may be 0.1 μm, because a vapor-deposited metal layer is dense. Accordingly, the preferred thickness of the barrier layer is 0.1–0.5 μm.

As described above, the barrier layer sandwiched by the carrier layer and the wiring-forming layer both having flat surfaces is characterized by forming a continuous layer substantially free from such defects as to permit an etching solution to penetrate therethrough, even after pressure welding. The fact that the barrier layer is substantially free from defects can be confirmed by observation by a scanning-type electron microscope (SEM) at a magnification of 4,000 after removal of the carrier layer by etching. Alternatively, it can be confirmed by observation as to whether or not the wiring-forming layer is etched, after a composite from which the carrier layer is removed is immersed in an etching solution having no etchability to the barrier layer.

The term "average surface roughness Rz" used herein is defined as follows: The surface roughness of a sample is measured by a scanning-type laser microscope (OLS1000, available from Olympus Optical Co., Ltd.) in a plurality (5) of areas to obtain a surface roughness curve in each area. In an arbitrary range of 176 μm in length in each surface roughness curve, an interval is determined between an average height of the five highest peaks and an average depth of the five deepest valleys. Among the resultant intervals determined in the five measured areas, the maximum interval and the minimum interval are omitted. Thus, the average surface roughness Rz is calculated by averaging the three intervals. Also, the term "maximum surface roughness Rmax" used herein is defined as the maximum among the intervals between the highest peak and the deepest valley in any arbitrary ranges of 176 μm in length in the surface roughness curves.

[2] Production of Wiring Layer Transfer Composite (A) First Production Method

The method for producing a wiring layer transfer composite according to the present invention comprises the steps of (a) preparing a first Cu-based metal foil having an average thickness of 50 μm or less and an average surface roughness Rz of 5 μm or less in both surfaces for a carrier layer; (b) preparing a second Cu-based metal foil having an average thickness of 20 μm or less and an average surface roughness Rz of 5 μm or less in both surfaces for a wiring-forming layer; (c) plating a metal having different etchability from that of Cu onto the first metal foil or the second metal foil to form a barrier layer having an average thickness of 1 μm or less; (d) conducting an activation treatment onto a surface of the barrier layer and a surface of the first or second metal foil on which the barrier layer is not formed; and (e) pressure-welding both metal foils in such a manner that the activated surfaces are facing each other. Though this method is applicable to the production of composite metal foils not restricted to wiring layer transfer, detailed explanation will be made on each step in the case of the wiring layer transfer.

(a) Preparation of First Metal Foil

Because the first metal foil for a carrier layer made of pure Cu or a Cu-based alloy should have flat surfaces on both sides, it is preferably produced by a rolling method, an electrolysis method, etc. In the case of a copper foil, those produced by these methods are called rolled copper and electrolytic copper, respectively, and the rolled copper is more preferable from the aspect of surface roughness. Specific examples of the rolled copper include, for instance, JIS H3100, 3110, 3130, etc.

(b) Preparation of Second Metal Foil

Because the second metal foil for a wiring-forming layer made of pure Cu or a Cu-based alloy should have flat surfaces on both sides like the first metal foil, it is preferably rolled copper or electrolytic copper, and the rolled copper is more preferable from the aspect of surface roughness.

(c) Formation of Barrier Layer

Because the barrier layer is as thin as 1 μm or less, it cannot be bonded without breakage by a pressure welding method. Accordingly, because the barrier layer should be formed by plating on the first metal foil and/or the second metal foil only in surfaces to be pressure-welded in the first production method, their surfaces not to be pressure-welded are coated with resist films, etc. in advance. The plating method is preferably a Ni plating method, though detailed explanation will be omitted here on its plating conditions per se because they are well known in the art.

(d) Activation Treatment

An activation treatment is conducted on their surfaces to be pressure-welded (a surface of the barrier layer, and a surface of the carrier layer or the wiring-forming layer, on which the barrier layer is not formed), such that the two metal foils are well pressure-welded by rolling at a small draft (rolling reduction). Though the surfaces to be pressure-welded can be activated simply by mechanical polishing, it is preferable to etch the surfaces to be pressure-welded by sputtering of ions such as Ar ion under reduced pressure, to activate them without generating defects such as breakage in an extremely thin barrier layer. The sputtering etching may be carried out at room temperature. By sputtering etching at room temperature, a diffusion layer is prevented from being formed between the metal foil and the barrier layer. The vacuum degree in a vacuum chamber is preferably 1 to $1 \times 10^{-3}$ Pa. To prevent the smallest amount of air from remaining in the vacuum chamber, the vacuum chamber is first filled with an Ar gas atmosphere and then evacuated.

(e) Pressure Welding

With an activation treatment conducted on the surfaces to be pressure-welded, the first metal foil can be pressure-welded to the second metal foil via the barrier layer at a temperature of lower than 300° C., particularly at room temperature. The pressure welding method is preferably a rolling method by which metal foil ribbons can be pressure-welded continuously. The draft of rolling may be 2% or less, and pressure welding may be conducted by simply applying pressure, namely at substantially zero draft.

To prevent air from being entrapped and metal oxides from being formed in a pressure-welded interface, pressure welding is preferably carried out in an inert gas atmosphere or in a vacuum chamber. When pressure welding is carried out in a vacuum chamber, it is preferable to carry out pressure welding by rolling continuously with the activation treatment in the same vacuum chamber.

(B) Second Production Method

The second method for producing a wiring layer transfer composite according to the present invention comprises the steps of (a) preparing a first Cu-based metal foil having an average thickness of 50 μm or less and an average surface roughness Rz of 5 μm or less in both surfaces for a carrier layer; (b) preparing a second Cu-based metal foil having an average thickness of 20 μm or less and an average surface roughness Rz of 5 μm or less in both surfaces for a wiring-forming layer; (c) plating a metal having different etchability from that of Cu onto the first metal foil or the second metal foil to form a barrier layer having an average thickness of 1 μm or less; (d) heating both of the first and second metal foils to a temperature of 300° C. or higher; and (e) pressure-welding both metal foils via the barrier layer.

Because the steps (a)–(c) and (e) among the above steps are the same as those in the first production method, explanation will be made here only on the step (d).

Heat treatment of both metal foils at 300° C. or higher makes it easier to pressure-weld the metal foils by rolling. To prevent both metal foils and a barrier layer from being oxidized, the heat treatment is carried out in an inert gas atmosphere or in vacuum. In the case of vacuum, the vacuum degree is preferably 1 to $1 \times 10^{-3}$ Pa. To prevent the smallest amount of air from remaining in the vacuum chamber, the vacuum chamber is first filled with an inert gas atmosphere and then evacuated. The heating temperature should be 300° C. or higher, at which a metal foil based on Cu is completely softened. If the heating temperature were too high, diffusion would be likely to occur in an interface of the metal foil and the barrier layer. Therefore, the upper limit of the heating temperature is preferably 600° C. The more preferred heating temperature is 400–600° C. Because of heat treatment in vacuum, rolling can be carried out at a draft of 2% or less, particularly at a substantially zero draft, resulting in prevention of breakage in the barrier layer. By continuously carrying out heat treatment and rolling in a vacuum chamber, pressure welding can be achieved surely at a lower draft with high efficiency.

(C) Third Production Method

The third method for producing a wiring layer transfer composite according to the present invention comprises the steps of (a) preparing a first Cu-based metal foil having an average thickness of 50 μm or less and an average surface roughness Rz of 5 μm or less in both surfaces for a carrier layer; (b) preparing a second Cu-based metal foil having an average thickness of 20 μm or less and an average surface roughness Rz of 5 μm or less in both surfaces for a wiring-forming layer; (c) vapor-depositing a metal having different etchability from that of Cu onto at least one of the first metal foil and the second metal foil to form a barrier layer having an average thickness of 1 μm or less; and (d) pressure-welding both metal foils via the barrier layer.

Because the steps (a), (b) and (d) among the above steps are the same as those in the first production method, explanation will be made here only on the step (c). This method is also applicable to the production of composite metal foils not restricted to wiring layer transfer.

In this production method, the barrier layer is formed by a vapor deposition method. In a vacuum chamber for vapor deposition, a vapor deposition means is disposed at such a position that a barrier layer is formed on the first metal foil and/or the second metal foil only in surfaces to be pressure-welded. Specific examples of the vapor deposition include vacuum vapor deposition, ion plating, sputtering, etc., and vacuum vapor deposition and sputtering are preferable because vapor-deposited surfaces obtained by these methods, which are substantially free from contamination, ensure pressure welding by the subsequent rolling. Incidentally, a plating layer may be formed as a primer layer for a vapor deposition layer.

The vacuum degree in a vacuum chamber for vapor deposition is preferably 1 to $1\times10^{-3}$ Pa. To prevent the smallest amount of air from remaining in the vacuum chamber, the vacuum chamber is first filled with an Ar gas and then evacuated.

One example of an apparatus for continuously carrying out vapor deposition and pressure welding in the same vacuum chamber is shown in FIG. 1. This apparatus comprises a reel 12 for winding a first metal foil 11, a reel 14 for winding a second metal foil 13, a pair of guide rolls 17 disposed at a position opposite to a vapor deposition means 16, a pair of pressure rolls 18 disposed downstream of the guide rolls 17, and a reel 20 for winding a metal foil laminate 19. A barrier layer metal is vapor-deposited onto the first metal foil 11 and the second metal foil 13 when they are passing over a pair of guide rolls 17 facing the vapor deposition means 16. The first and second, vapor-deposited metal foils 11, 13 pass through a pair of pressure rolls 18 to be pressure-welded. A laminate 19 formed by pressure welding is wound around the reel 20.

[3] Transfer of Wiring

The wiring layer transfer composite of the present invention is used for transferring wiring for a semiconductor chip to a semiconductor package. The transfer method may be (i) a method in which a wiring-forming layer of a wiring layer transfer composite is etched in a wiring pattern and then subjected to transfer molding with a semiconductor-sealing material, and then a carrier layer and a barrier layer are etched away, thereby transferring the wiring to a semiconductor package; (ii) a method in which a wiring layer transfer composite is fixed to a semiconductor package by transfer molding, a carrier layer and a barrier layer are etched away, and finally a wiring-forming layer is etched to form a wiring pattern, etc. However, the transfer method of the wiring layer transfer composite of the present invention is not restricted to these methods. Of course, the wiring layer transfer composite may also be used for wiring of various other devices having large numbers of connection pins like the semiconductor packages.

The present invention will be described in detail referring to the following without intention of limiting the present invention thereto.

EXAMPLE 1

Figure 3:
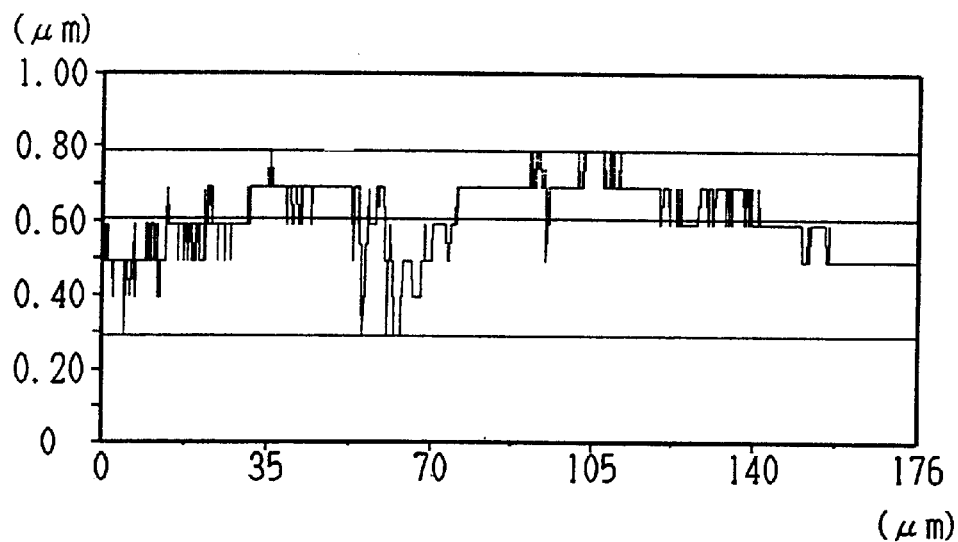
FIG. 3 is a graph showing the measurement results of a surface roughness of a rolled Cu foil for a wiring-forming layer in EXAMPLE 1.

A rolled Cu foil ribbon of 10 μm in thickness, 200 mm in width and 500 m in length was used for a wiring-forming layer. The surface roughness of this rolled Cu foil ribbon was determined from measurement results by a scanning-type laser microscope (OLS1000, available from Olympus Optical Co., Ltd.) in a region of 176 μm in length. FIG. 3 shows one example of the measurement results of surface roughness. The surface roughness of a copper foil ribbon for a wiring-forming layer is shown below.

|  | Average Surface Roughness Rz | Maximum Surface Roughness Rmax |
|---|---|---|
| Surface To Be Pressure-Welded | 0.38 μm | 0.50 μm |
| Surface Not To Be Pressure-Welded | 0.35 μm | 0.47 μm |

A rolled Cu foil ribbon of 25 μm in thickness, 200 mm in width and 500 m in length was used for a carrier layer. The surface roughness of this rolled Cu foil ribbon on both surfaces was determined in the same manner as above. The surface roughness was like shown in FIG. 3, with their average surface roughness Rz and maximum surface roughness Rmax shown below.

|  | Average Surface Roughness Rz | Maximum Surface Roughness Rmax |
|---|---|---|
| Surface To Be Pressure-Welded | 0.35 μm | 0.42 μm |
| Surface Not To Be Pressure-Welded | 0.33 μm | 0.40 μm |

The rolled Cu foil ribbon for a carrier layer was Ni-plated in an average thickness of 0.4 μm for a barrier layer in a surface to be pressure-welded. Etching with Ar ion was continuously carried out onto a surface of a Ni plating layer on the rolled Cu foil ribbon for a carrier layer and a surface of a rolled Cu foil ribbon for a wiring-forming layer at a speed of 1 m/minute at room temperature in a vacuum chamber shown in FIG. 1. Both metal foil ribbons were then continuously pressure-welded with both activated surfaces in contact with each other by rolling at a speed of 1 m/minute and at a draft of about 1% without heating in the same vacuum chamber.

Figure 2:
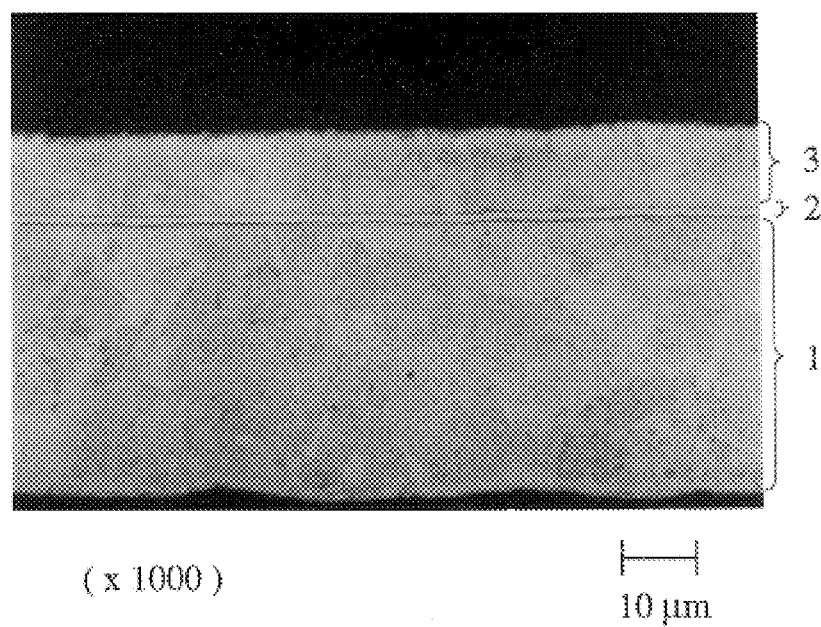
FIG. 2 is a photomicrograph showing a metal microstructure in a cross section of the wiring layer transfer composite in EXAMPLE 1.

The resultant wiring layer transfer composite was a laminate ribbon constituted by a carrier layer, a barrier layer, and a wiring-forming layer. The metal microstructure of the wiring layer transfer composite in its cross section was observed by an optical electron microscope at a magnification of 1,000. The resultant photomicrograph of the metal microstructure is shown in FIG. 2. It was found from FIG. 2 that a thin barrier layer 2 was uniformly formed between a carrier layer 1 and a wiring-forming layer 3.

With respect to one of 50-mm-long samples cut away from this laminate, a peeling test between the wiring-forming layer and the carrier layer was conducted, resulting in breakage only in the body of the wiring-forming layer without interlaminar peeling. It was confirmed from this result that both layers were strongly welded to each other.

After another sample was covered with a commercially available chemical-resistant tape in a surface of a wiring-forming layer, it was immersed in an alkali etchant (tradename: A Process, available from Japan Meltex Inc.) to remove a carrier layer. The immersion of the sample in the etching solution was continued for 30 minutes after the completion of removal of the carrier layer. As a result, it was found that the Ni plating layer was substantially free from defects, and that the wiring-forming layer was not etched at all. The observation of the exposed surface of the Ni plating layer by a scanning-type electron microscope (SEM) at a magnification of 4,000 revealed that there was no breakage in the Ni plating layer.

EXAMPLE 2

Figure 4:
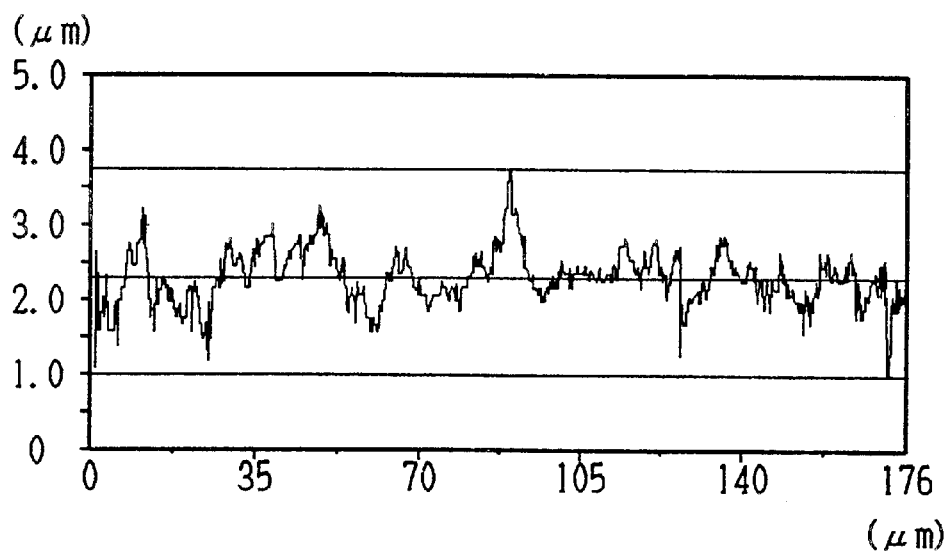
FIG. 4 is a graph showing the measurement results of a surface roughness of an electrolytic Cu foil for a wiring-forming layer in EXAMPLE 2.

An electrolytic Cu foil ribbon of 10 μm in thickness, 200 mm in width and 500 m in length was used for a wiring-forming layer. The surface roughness of this electrolytic Cu foil ribbon on both surfaces was measured in the same manner as in EXAMPLE 1. FIG. 4 shows one example of the measurement results of surface roughness. The surface roughness of the electrolytic Cu foil ribbon for a wiring-forming layer is shown below.

|  | Average Surface Roughness Rz | Maximum Surface Roughness Rmax |
| --- | --- | --- |
| Surface To Be Pressure-Welded | 2.0 μm | 2.8 μm |
| Surface Not To Be Pressure-Welded | 2.2 μm | 2.7 μm |

A rolled Cu foil ribbon of 25 μm in thickness, 200 mm in width and 500 m in length was used for a carrier layer, and the surface roughness of this rolled Cu foil ribbon on both surfaces was measured in the same manner as in EXAMPLE 1. As a result, the surface roughness was like shown in FIG. 3, with their average surface roughness Rz and maximum surface roughness Rmax shown below.

|  | Average Surface Roughness Rz | Maximum Surface Roughness Rmax |
| --- | --- | --- |
| Surface To Be Pressure-Welded | 0.31 μm | 0.40 μm |
| Surface Not To Be Pressure-Welded | 0.34 μm | 0.44 μm |

The rolled Cu foil ribbon for a carrier layer was Ni-plated in an average thickness of 1 μm for a barrier layer in a surface to be pressure-welded. Both Cu foil ribbons were heated to 500° C. in an inert gas atmosphere, and then continuously pressure-welded with one surface of the electrolytic Cu foil ribbon for a wiring-forming layer and a surface of the Ni plating layer on the rolled Cu foil ribbon for a carrier layer in contact with each other, by rolling at a speed of 10 m/minute and at a draft of about 1%.

The resultant wiring layer transfer composite was a laminate ribbon constituted by a carrier layer, a barrier layer, and a wiring-forming layer. With respect to one of 50-mm-long samples cut away from this laminate, a peeling test between the wiring-forming layer and the carrier layer was conducted, resulting in breakage only in the body of the wiring-forming layer without interlaminar peeling. It was confirmed from this result that both layers were strongly welded to each other.

After another sample was covered with a commercially available chemical-resistant tape in a surface of a wiring-forming layer, it was immersed in an alkali etchant (tradename: A Process, available from Japan Meltex Inc.) to remove a carrier layer. The immersion of the sample in the etching solution was continued for 30 minutes after the completion of removal of the carrier layer. As a result, it was found that the Ni plating layer was substantially free from defects, and that the wiring-forming layer was not etched at all. The observation of the exposed surface of the Ni plating layer by a scanning-type electron microscope (SEM) at a magnification of 4,000 revealed that there was no breakage in the Ni plating layer.

EXAMPLE 3

A rolled Cu foil ribbon of 10 μm in thickness, 200 mm in width and 500 m in length was used for a wiring-forming layer, and the surface roughness of this rolled Cu foil ribbon on both surfaces was measured in the same manner as in EXAMPLE 1. As a result, the surface roughness was the same as shown in FIG. 3, with their average surface roughness Rz and maximum surface roughness Rmax shown below.

|  | Average Surface Roughness Rz | Maximum Surface Roughness Rmax |
| --- | --- | --- |
| Surface To Be Pressure-Welded | 0.38 μm | 0.50 μm |
| Surface Not To Be Pressure-Welded | 0.35 μm | 0.47 μm |

A rolled Cu foil ribbon of 25 μm in thickness, 200 mm in width and 500 m in length was used for a carrier layer, and the surface roughness of his rolled Cu foil ribbon on both surfaces was measured in the same manner as in EXAMPLE 1. As a result, the surface roughness was the same as shown in FIG. 3, with their average surface roughness Rz and maximum surface roughness Rmax shown below.

|  | Average Surface Roughness Rz | Maximum Surface Roughness Rmax |
| --- | --- | --- |
| Surface To Be Pressure-Welded | 0.35 μm | 0.42 μm |
| Surface Not To Be Pressure-Welded | 0.33 μm | 0.40 μm |

Both rolled Cu foil ribbons were charged into a vacuum chamber having a structure shown in FIG. 1, and subjected to vapor deposition of Ni at room temperature while passing over a pair of guide rolls at a speed of 30 m/minute. The resultant Ni vapor deposition layer was 0.2 μm in an average thickness. Both rolled Cu foil ribbons were continuously pressure-welded with their Ni vapor deposition layers in contact with each other, by rolling at a speed of 30 m/minute and at a draft of 1% or less without heating in the same vacuum chamber.

The resultant wiring layer transfer composite was a laminate ribbon constituted by a carrier layer, a barrier layer, and a wiring-forming layer. With respect to one of 50-mm-long samples cut away from this laminate, a peeling test between the wiring-forming layer and the carrier layer was conducted, resulting in breakage only in the body of the wiring-forming layer without interlaminar peeling. It was confirmed from this result that both layers were strongly welded to each other.

After another sample was covered with a commercially available chemical-resistant tape in a surface of a wiring-forming layer, it was immersed in an alkali etchant (tradename: A Process, available from Japan Meltex Inc.) to remove a carrier layer. The immersion of the sample in the etching solution was continued for 30 minutes after the completion of removal of the carrier layer. As a result, it was found that the Ni plating layer was substantially free from defects, and that the wiring-forming layer was not etched at all. The observation of the exposed surface of the Ni plating layer by a scanning-type electron microscope (SEM) at a magnification of 4,000 revealed that there was no breakage in the Ni plating layer.

COMPARATIVE EXAMPLE 1

Figure 5:
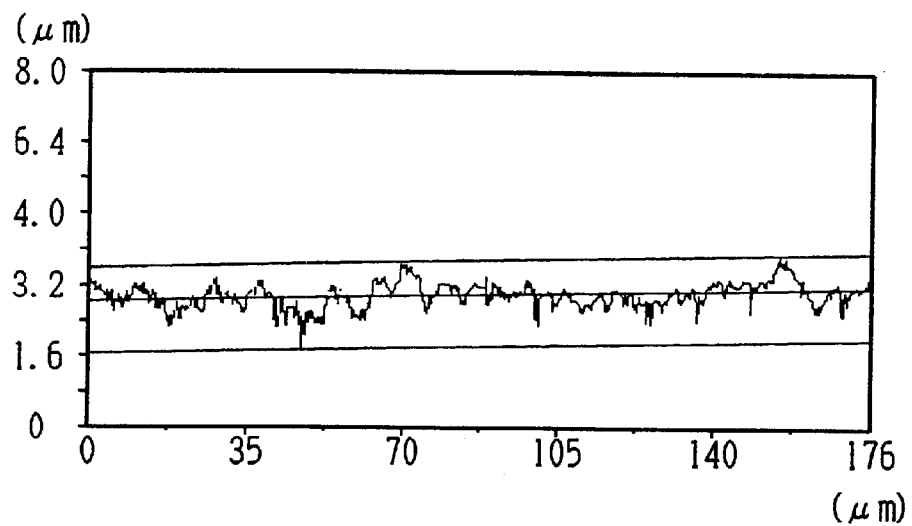
FIG. 5 is a graph showing the measurement results of a surface roughness of an electrolytic Cu foil for a wiring-forming layer in a surface to be pressure-welded in COMPARATIVE EXAMPLE 1.
Figure 6:
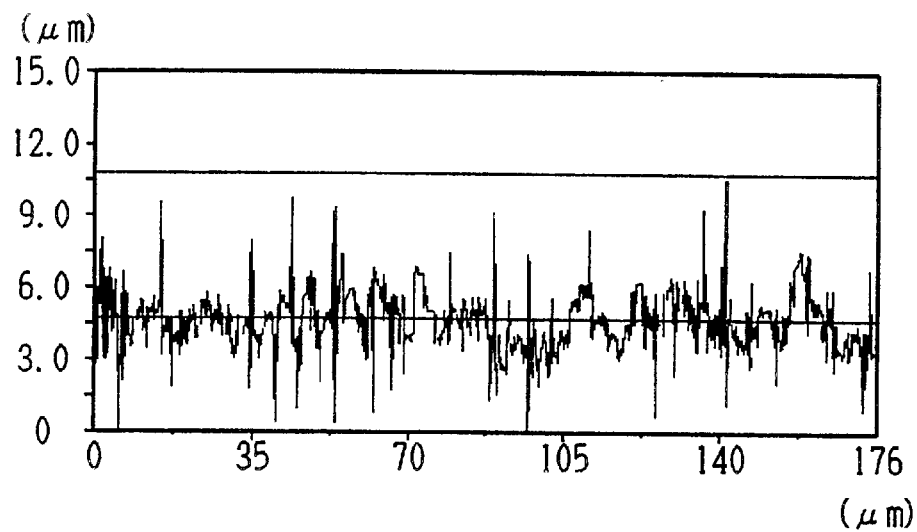
FIG. 6 is a graph showing the measurement results of a surface roughness of an electrolytic Cu foil for a wiring-forming layer in a surface not to be pressure-welded in COMPARATIVE EXAMPLE 1.
Figure 7:
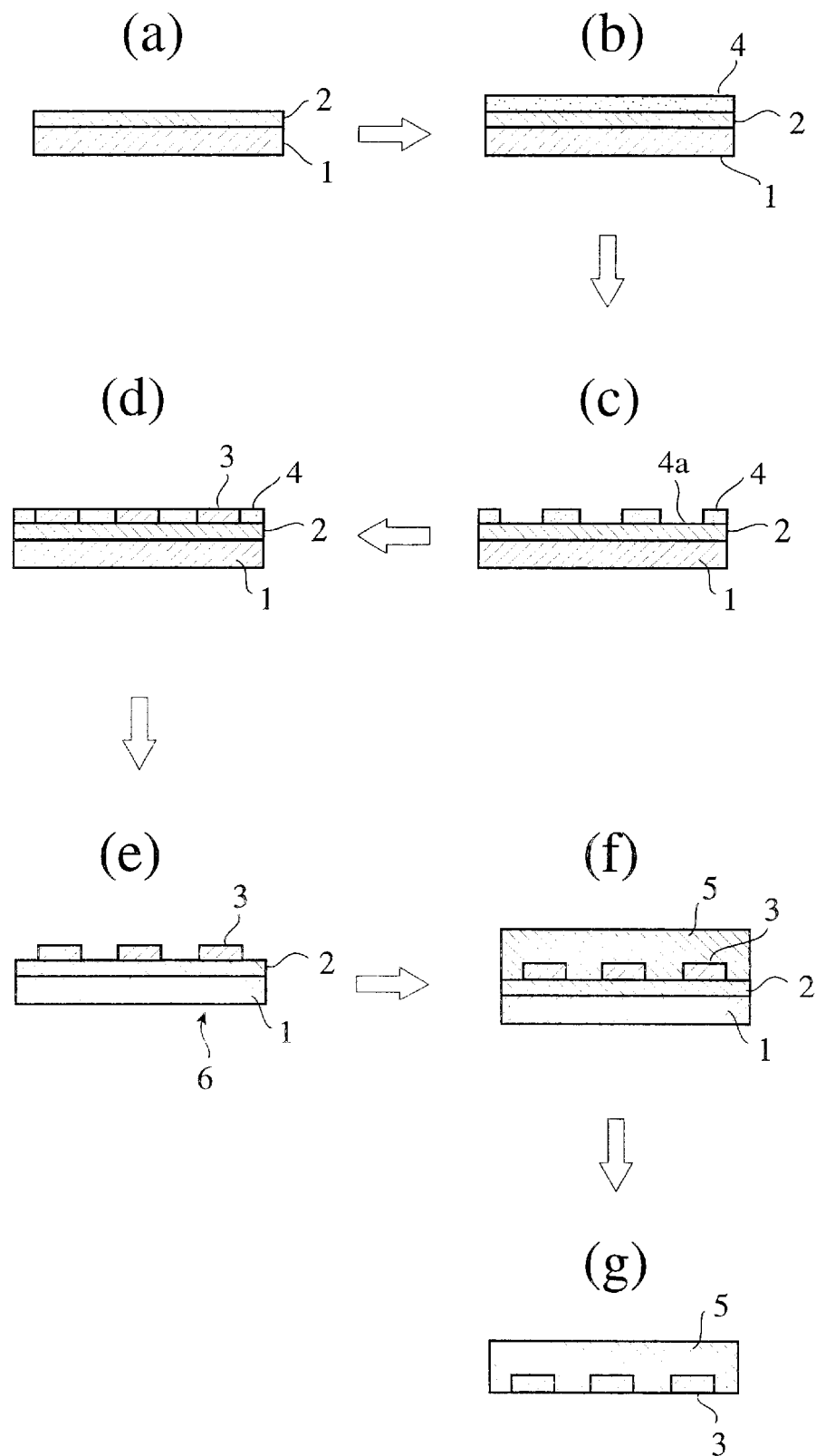
FIG. 7 is a schematic view showing the steps of a transfer method.

An electrolytic Cu foil ribbon of 10 μm in thickness, 200 mm in width and 500 m in length was used for a wiring-forming layer. The surface roughness of this electrolytic Cu foil ribbon on both surfaces was measured in the same manner as in EXAMPLE 1. FIG. 5 shows the measurement results of surface roughness in a surface to be pressure-welded, and FIG. 6 shows the measurement results of surface roughness in a surface not to be pressure-welded. The average surface roughness Rz and the maximum surface roughness Rmax in each surface are shown below.

|  | Average Surface Roughness Rz | Maximum Surface Roughness Rmax |
|---|---|---|
| Surface To Be Pressure-Welded | 1.3 μm | 1.8 μm |
| Surface Not To Be Pressure-Welded | 9.4 μm | 11.0 μm |

A rolled Cu foil ribbon of 25 μm in thickness, 200 mm in width and 500 m in length was used for a carrier layer, and the surface roughness of this rolled Cu foil ribbon on both surfaces was measured in the same manner as in EXAMPLE 1. As a result, the surface roughness was like shown in FIG. 3, with their average surface roughness Rz and maximum surface roughness Rmax shown below.

|  | Average Surface Roughness Rz | Maximum Surface Roughness Rmax |
|---|---|---|
| Surface To Be Pressure-Welded | 0.35 μm | 0.41 μm |
| Surface Not To Be Pressure-Welded | 0.35 μm | 0.44 μm |

The rolled Cu foil ribbon for a carrier layer was Ni-plated in an average thickness of 1 μm for a barrier layer in a surface to be pressure-welded. Etching with Ar ion for an activation treatment was continuously carried out onto a surface of a Ni plating layer on the rolled Cu foil ribbon for a carrier layer and a surface of a rolled Cu foil ribbon for a wiring-forming layer at a speed of 1 m/minute at room temperature in a vacuum chamber shown in FIG. 1. Both metal foil ribbons were then continuously pressure-welded with both activated surfaces in contact with each other by rolling at a speed of 1 m/minute and at a draft of about 1% without heating in the same vacuum chamber.

The resultant wiring layer transfer composite was a laminate ribbon constituted by a carrier layer, a barrier layer, and a wiring-forming layer. With respect to one of 50-mm-long samples cut away from this laminate, a peeling test between the wiring-forming layer and the carrier layer was conducted, resulting in breakage only in the body of the wiring-forming layer without interlaminar peeling.

After another sample was covered with a commercially available chemical-resistant tape in a surface of a wiring-forming layer, it was immersed in an alkali etchant (tradename: A Process, available from Japan Meltex Inc.) to remove a carrier layer. The immersion of the sample in the etching solution was continued for 30 minutes after the completion of removal of the carrier layer. As a result, it was found that the wiring-forming layer was etched. The observation of the exposed surface of the Ni plating layer by a scanning-type electron microscope (SEM) at a magnification of 4,000 revealed that there was breakage in the Ni plating layer.

As described above, by using a Cu foil ribbon for a carrier layer and a Cu foil ribbon for a wiring-forming layer, which are flat in both surfaces, by forming a thin barrier layer of 1 μm or less in a average thickness on either one or both of the Cu foil ribbons, and by subjecting their surfaces to be pressure-welded to an activation treatment or a heat treatment, if necessary, both Cu foil ribbons can be pressure-welded by rolling at a high speed without generating defects such as breakage in the barrier layer according to the present invention. Because the pressure welding of both Cu foil ribbons via a barrier layer can be carried out by rolling at a high speed, the production cost of the wiring layer transfer composite can be decreased. Pressure welding by high-speed rolling can be achieved particularly in the case of forming a barrier layer by vapor deposition on both metal foils in surfaces to be pressure-welded. By carrying out vapor deposition and rolling continuously in the same vacuum chamber, the production efficiency of the wiring layer transfer composite is further improved. By using the wiring layer transfer composite of the present invention, cost in the etching process can drastically be reduced in the production of semiconductor packages.

What is claimed is:

1. A method for producing a composite metal foil comprising a three-layered laminate, which laminate comprises a carrier layer, a barrier layer and a wiring-forming layer, said wiring-forming layer being etched to form a wiring of semiconductor packages, comprising the steps of
    (a) rolling in a vacuum chamber a first Cu-based metal foil having an average thickness of 50 μm or less and an average surface roughness Rz of 5 μm or less in both surfaces, and a Cu-based metal foil having an average thickness of 20 μm or less and an average surface roughness Rz of 5 μm or less in both surfaces, followed by
    (b) vapor-depositing a metal having different etchability from that of Cu onto at least one of said first metal foil and said second metal foil to form said barrier layer having an average thickness of 1 μm or less; and thereafter
    (c) pressure-welding both metal foils via said barrier layer by rolling at a draft of 2% or less to form said barrier layer as a continuous layer substantially free from defects.

2. The method for producing a composite metal foil according to claim 1, wherein said vapor-depositing is carried out under a pressure of 1 to $1 \times 10^{-3}$ Pa.

3. The method for producing a composite metal foil according to claim 2, wherein said pressure-welding is carried out at a temperature of lower than 300° C.

4. The method for producing a composite metal foil according to claim 1, wherein said pressure-welding is carried out at a temperature of lower than 300° C.

5. The method for producing a composite metal foil according to claim 1, wherein an apparatus is used for producing a composite metal foil comprising a first Cu-based metal foil having an average thickness of 50 μm or less and an average surface roughness Rz of 5 μm or less in both surfaces, a second Cu-based metal foil having an average thickness of 20 μm or less and an average surface roughness Rz of 5 μm or less in both surfaces, and a barrier layer sandwiched by said first Cu-based metal foil and said second Cu-based metal foil, said barrier layer being a continuous layer substantially free from defects, wherein said apparatus comprises a vacuum chamber, a vapor deposition means disposed in said vacuum chamber, a pair of guide rolls disposed in said vacuum chamber at a position opposite to said vapor deposition means, and pressure rolls disposed downstream of said guide rolls for continuously pressure-welding a first metal foil and a second metal foil which are subjected to vapor deposition while passing over said guide rolls in such a manner that vapor-deposited surfaces of said first and second metal foils are opposing each other.

6. A method for producing a wiring layer transfer composite comprising a laminate, which laminate comprises a carrier layer, a barrier layer and a wiring-forming layer, said barrier layer being a continuous layer substantially free from defects, comprising the steps of (a) preparing a first Cu-based metal foil having an average thickness of 50 µm or less and an average surface roughness Rz of 5 µm or less in both surfaces for said carrier layer; (b) preparing a second Cu-based metal foil having an average thickness of 20 µm or less and an average surface roughness Rz of 5 µm or less in both surfaces for said wiring-forming layer; (c) vapor-depositing a metal having different etchability from that of Cu onto at least one of said first metal foil and said second metal foil to form said barrier layer having an average thickness of 1 µm or less; and (d) pressure-welding both metal foils via said barrier layer.

7. The method for producing a wiring layer transfer composite according to claim 6, wherein the pressure welding is achieved by rolling at a draft of 2% or less.

8. The method for producing a wiring layer transfer composite according to claim 7, wherein said barrier layer is formed by vacuum vapor deposition.

9. The method for producing a composite metal foil according to claim 8, wherein said vapor-depositing is carried out under a pressure of 1 to $1 \times 10^{-3}$ Pa.

10. The method for producing a wiring layer transfer composite according to claim 7, wherein the vapor deposition and the pressure Welding are continuously carried out in the same vacuum chamber.

11. The method for producing a wiring layer transfer composite according to claim 10, wherein said pressure-welding is carried out at a temperature of lower than 300° C.

12. The method for producing a wiring layer transfer composite according to claim 6, wherein said barrier layer is formed by vacuum vapor deposition.

13. The method for producing a composite metal foil according to claim 12, wherein said vapor-depositing is carried out under a pressure of 1 to $1 \times 10^{-3}$ Pa.

14. The method for producing a wiring layer transfer composite according to claim 12, wherein the vapor deposition and the pressure welding are continuously carried out in the same vacuum chamber.

15. The method for producing a wiring layer transfer composite according to claim 14, wherein said pressure-welding is carried out at a temperature of lower than 300° C.

16. The method for producing a wiring layer transfer composite according to claim 6, wherein the vapor deposition and the pressure welding are continuously carried out in the same vacuum chamber.

17. The method for producing a wiring layer transfer composite according to claim 16, wherein said pressure-welding is carried out at a temperature of lower than 300° C.

* * * * *